(12) United States Patent
Keat et al.

(10) Patent No.: US 11,817,360 B2
(45) Date of Patent: Nov. 14, 2023

(54) CHIP SCALE PACKAGE SEMICONDUCTOR DEVICE AND METHOD OF MANUFACTURE

(71) Applicant: NEXPERIA B.V., Nijmegen (NL)

(72) Inventors: Loh Choong Keat, Nijmegen (NL); Edward Then, Nijmegen (NL); Weng Khoon Mong, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 32 days.

(21) Appl. No.: 16/220,160

(22) Filed: Dec. 14, 2018

(65) Prior Publication Data
US 2019/0189530 A1 Jun. 20, 2019

(30) Foreign Application Priority Data
Dec. 20, 2017 (CN) .......................... 201711383469.8

(51) Int. Cl.
*H01L 23/31* (2006.01)
*H01L 23/00* (2006.01)
(Continued)

(52) U.S. Cl.
CPC .......... *H01L 23/3171* (2013.01); *H01L 21/56* (2013.01); *H01L 21/561* (2013.01); *H01L 21/565* (2013.01); *H01L 23/13* (2013.01); *H01L 23/16* (2013.01); *H01L 23/3114* (2013.01); *H01L 23/3121* (2013.01); *H01L 23/3185* (2013.01); *H01L 23/544* (2013.01);
(Continued)

(58) Field of Classification Search
CPC ..... H01L 2924/181; H01L 2224/73265; H01L 2224/49171; H01L 24/49; H01L 21/56; H01L 23/3114; H01L 23/4951; H01L 33/66; H01L 23/49555; H01L 23/49861; H01L 23/49541; H01L 23/49548; H01L 23/49565; H01L 23/49568; H01L 23/3675
USPC ......... 257/666, 787; 438/111, 112, 123, 124, 438/127
See application file for complete search history.

(56) References Cited

U.S. PATENT DOCUMENTS 5,554,886 A * 9/1996 Song ................... H01L 23/4951
257/666
5,835,988 A * 11/1998 Ishii ..................... H01L 23/3107
257/684

(Continued)

OTHER PUBLICATIONS

Extended European Search Report for priority European application No. EP18202874.6, 7 pages, dated Mar. 14, 2019.

*Primary Examiner* — David A Zarneke
(74) *Attorney, Agent, or Firm* — Ruggiero, McAllister & McMahon, LLC (57) ABSTRACT

A semiconductor device and a method of manufacturing a semiconductor device. The chip scale package semiconductor device comprises: a semiconductor die having a first major surface and an opposing second major surface, the semiconductor die comprising at least two terminals arranged on the second major surface; a carrier comprising a first major surface and an opposing second major surface, wherein the first major surface of the semiconductor die is mounted on the opposing second major surface of the carrier; and a molding material partially encapsulating the semiconductor die and the carrier, wherein the first major surface of the carrier extends and is exposed through molding material, and the at least two terminals are exposed through molding material on a second side of the device.

10 Claims, 7 Drawing Sheets

(51) Int. Cl.
  *H01L 23/13*     (2006.01)
  *H01L 21/56*     (2006.01)
  *H01L 23/544*    (2006.01)
  *H01L 23/16*     (2006.01)

(52) U.S. Cl.
  CPC .............. *H01L 24/32* (2013.01); *H01L 24/96* (2013.01); *H01L 24/83* (2013.01); *H01L 24/97* (2013.01); *H01L 2223/54406* (2013.01); *H01L 2223/54426* (2013.01); *H01L 2223/54433* (2013.01); *H01L 2223/54486* (2013.01); *H01L 2224/2919* (2013.01); *H01L 2224/32225* (2013.01); *H01L 2224/83851* (2013.01); *H01L 2224/83862* (2013.01); *H01L 2224/97* (2013.01); *H01L 2924/1815* (2013.01)

(56) References Cited

U.S. PATENT DOCUMENTS

| | | | | |
|---|---|---|---|---|
| 6,433,418 | B1 * | 8/2002 | Fujisawa | H01L 21/565 257/666 |
| 6,495,944 | B2 * | 12/2002 | Hirano | H02N 1/008 137/1 |
| 6,707,148 | B1 * | 3/2004 | Mostafazedeh | H01L 27/15 257/432 |
| 7,151,320 | B2 * | 12/2006 | Shizuno | H01L 23/3114 257/787 |
| 7,476,980 | B2 * | 1/2009 | Rebibis | H01L 24/82 257/782 |
| 7,830,006 | B2 * | 11/2010 | Kolan | H01L 21/566 257/737 |
| 7,968,378 | B2 * | 6/2011 | Mahler | H01Q 19/30 438/113 |
| 8,283,768 | B2 * | 10/2012 | Kang | H01L 21/6835 257/690 |
| 8,853,003 | B2 * | 10/2014 | Xue | H01L 21/78 257/621 |
| 9,087,828 | B2 * | 7/2015 | Yilmaz | H01L 23/49503 |
| 9,449,911 | B1 * | 9/2016 | Kim | H01L 24/19 |
| 10,020,240 | B2 * | 7/2018 | Ozawa | H01L 23/3185 |
| 10,373,870 | B2 * | 8/2019 | Scanlan | H01L 21/561 |
| 2003/0134455 | A1 * | 7/2003 | Cheng | H01L 23/142 438/125 |
| 2006/0273451 | A1 * | 12/2006 | Kawabata | H01L 24/19 257/706 |
| 2007/0200257 | A1 * | 8/2007 | Chow | H01L 23/3128 257/787 |
| 2012/0217629 | A1 | 8/2012 | Cho et al. | |
| 2013/0147054 | A1 | 6/2013 | In et al. | |

* cited by examiner

CHIP SCALE PACKAGE SEMICONDUCTOR DEVICE AND METHOD OF MANUFACTURE

CROSS REFERENCE TO RELATED APPLICATION

The present application claims foreign priority to Chinese Patent Application No. 2017113834698 filed on Dec. 20, 2017, the entirety of which is incorporated by reference hereby.

FIELD

The present disclosure relates to a semiconductor device and method of manufacture. In particular the present disclosure relates to a chip scale package semiconductor device and associated method of manufacture.

BACKGROUND

Chip scale package (CSPs) semiconductor devices are becoming increasingly important for applications which require a small footprint. CSPs are commonly used, for instance, in mobile communications devices such as mobile telephones and portable electronic devices. When a CSP incorporates a power semiconductor device, such as a transistor or diode, they require high performance thermal capacity and heat dissipation because they are required to drain large currents to ground or other rails, to protect devices connected thereto from being damaged. On the other hand, the power devices face challenges to increase structural compactness, which requires on the one hand, to have a very small footprint and package height, and, on the other hand to be protected by a package material. The package material is necessary to protect the device from environmental factors such as moisture. In addition the package material prevents solder pastes used to mount the device to a printed circuit board from contacting and potentially short circuiting the body of the semiconductor die. Such arrangements typically have mold material on six sides of the device and are known as six-sided protected CSP devices.

Figure 1:
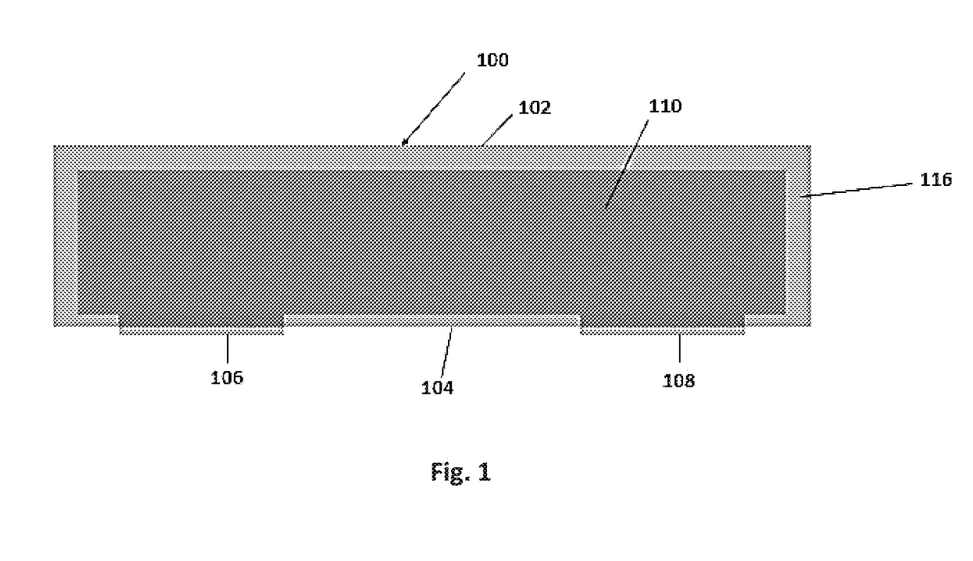
FIG. 1 is a cross-sectional view of a known chip scale package semiconductor device.

FIG. 1 is a cross-sectional view of a conventional six sided protected CSP device 100. The semiconductor device 100 has a top major surface 102 and an opposing bottom major surface 104. On the bottom major surface 104, the CSP semiconductor device 100 includes multiple contacts 106, 108. The contacts 106, 108 electrically connect to a bottom surface of a semiconductor die 110 to external circuit components, such as a printed circuit board (PCB) (not illustrated). The contacts 106, 108 are formed on a surface of the semiconductor die 110.

The semiconductor device 100 is packaged in a mold material 116 using any appropriate mold compound such as an epoxy based material. The mold material 116 is arranged to cover all six sides of the semiconductor die 110, with the exception of the contacts 106, 108.

Compared to conventional CSP semiconductor devices without mold compound, conventional six sided protected CSP device suffer from the problem of how to dissipate heat generated in the semiconductor die during operation. This is of particular concern when the semiconductor die is a power device.

SUMMARY

According to an embodiment there is provided a chip scale package semiconductor device, comprising; a semiconductor die having a first major surface and an opposing second major surface, the semiconductor die comprising at least two terminals arranged on the second major surface; a carrier comprising a first major surface and an opposing second major surface, wherein the first major surface of the semiconductor die is mounted on the opposing second major surface of the carrier; and a molding material partially encapsulating the semiconductor die and the carrier, wherein the first major surface of the carrier extends and is exposed through molding material, and the at least two terminals are exposed through molding material on a second side of the device.

The carrier may extend and be exposed through the molding material on opposing side walls of the device.

The first major surface of the carrier may be co-planar with the molding material on a top major surface of the device.

The opposing second major surface of the carrier may be arranged as a recess in the carrier. The recess may be arranged to mountably receive the semiconductor die. The recess may be arranged to receive an adhesive layer for mounting the semiconductor die to the carrier.

A top major surface of the package may comprise the carrier and a second opposing major surface of the package may comprise the terminals and the molding material.

According to an embodiment there is provided a method of manufacturing a chip scale package semiconductor device, the method comprising: providing a semiconductor die having a first major surface and an opposing second major surface, the semiconductor die comprising at least two terminals arranged on the second major surface; providing a carrier comprising a first major surface and an opposing second major surface; mounting the first major surface of the semiconductor die to the opposing second major surface of the carrier; partially encapsulating the semiconductor die and the carrier in a molding material, wherein the first major surface of the carrier extends and is exposed through molding material, and the at least two terminals are exposed through molding material on a second side of the device.

The semiconductor die and the carrier may be encapsulated such that the first major surface of the carrier is co-planar with the molding material on a top major surface of the device.

The first major surface of the semiconductor die may be mounted in recess arranged on the opposing second major surface of the carrier.

The CSP semiconductor device according to the embodiments provides for improved heat dissipation and structural integrity, without increasing the height of the overall package. The CSP device according to embodiments is therefore suited to high power transistor devices.

DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 2A:
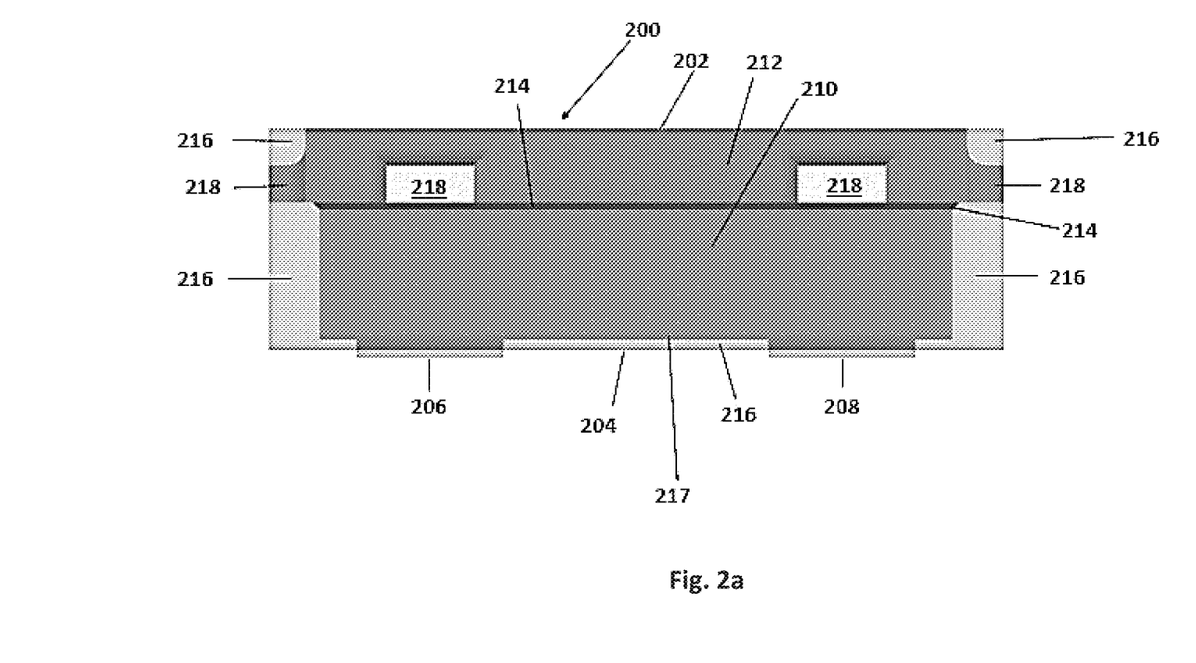
FIG. 2a is a cross-sectional of a chip scale package semiconductor device view according to an embodiment.

FIG. 2a is cross-sectional view of a six-sided Protected Chip Scale Package (CSP) semiconductor device 200 in accordance with an embodiment. The CSP semiconductor device 200 has a top major surface 202 and an opposing bottom major surface 204. On the bottom major surface 204, the CSP semiconductor device 200 includes multiple terminals or contacts 206, 208. The terminals 206, 208 electrically connect to a bottom surface of a semiconductor die 210 of the CSP semiconductor device 200 to external circuit components, such as a printed circuit board (PCB), not illustrated. The contacts 206, 208 are formed on a surface of the semiconductor die 210.

The top major surface 202 of the CSP semiconductor device 200 includes a metal (or plastic) carrier 212 to support the semiconductor die 210. The carrier 212 is fixedly mounted to a top surface of the semiconductor die 210 by any appropriate means, such as an epoxy based adhesive 214.

Whilst FIG. 2a, illustrates two contacts 206, 208 formed on the bottom surface of the semiconductor die 210, the skilled person will recognise that the any number of contacts may be provided dependent on the type and functionality of the semiconductor die 210. For example, where the semiconductor die is a field effect transistor, the number of contacts may be three, with respective contacts connected to corresponding source, gate and drain terminals of the semiconductor die 210. The semiconductor die 210 may alternatively be a bipolar junction transistor, thyristor or a two terminal diode. In addition a passivation layer 217 may be included on the surface of the semiconductor die 210 having the contacts 206, 208.

The CSP semiconductor device 200 is packaged in a mold material 216 using any appropriate mold compound such as an epoxy based material. The mold material may substantially cover the four minor sides of the CSP semiconductor device 200. With the exception of the contacts 206, 208, the mold material 216 may also be formed to cover the bottom major surface of the device 200. The mold material 216 may be arranged on the top major surface 202 of the device 200 so that a top surface of the carrier 212 is exposed.

The carrier 212 may also include one or more metal tabs 218 that extend from each side of the carrier 212 to protrude through the mold material 216 so as to be exposed at opposing sides of the CSP semiconductor device 200. The tabs 218 are an artefact of the singulation process of the CSP semiconductor device 200, which will be discussed in more detail below.

Figure 2B:
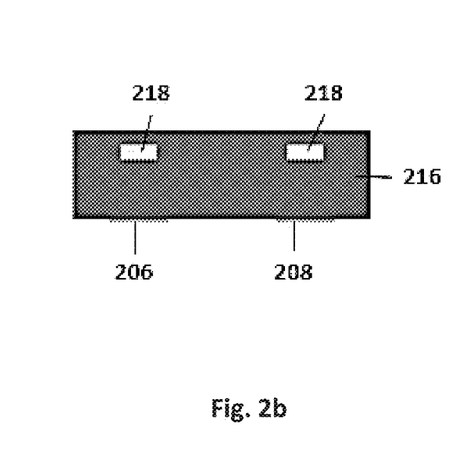
FIG. 2b is a side view of a chip scale package semiconductor device view according to an embodiment.

A side view of CSP semiconductor device 200 is illustrated in FIG. 2b, which shows the tabs 218, protruding through the mold material 216 on the side of the device 200. FIG. 2b illustrates one side of the device 200 and the skilled person will appreciate that the corresponding opposing side will have the same arrangement of tabs 218, 220 protruding through the mold material 216, due to the matrix arrangement of the carrier as discussed below.

Figure 2C:
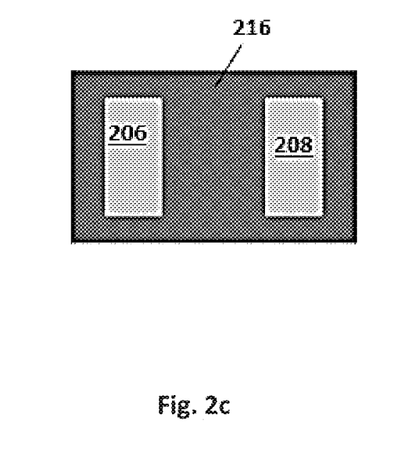
FIG. 2c is a bottom view of a chip scale package semiconductor device view according to an embodiment.
Figure 2D:
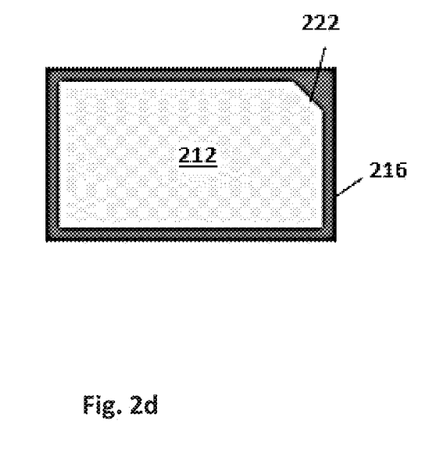
FIG. 2d is a top view of a chip scale package semiconductor device view according to an embodiment.

FIG. 2c illustrates a bottom view of the CSP semiconductor device 200 and shows the contacts 206, 208 and the mold material 216 arranged on the bottom surface 204 of the device 200. FIG. 2d illustrates a top view of the CSP semiconductor device 200 and shows the carrier 212 protrude through the mold material 216 such that the carrier is exposed on the top surface 202 of the device 200. An optional chamfer 222 may be arranged on the carrier 212, which may be used to indicate contact polarity and assist in device orientation when placing on PCB.

The arrangement of the carrier 212 to protrude through the top surface 202 of the device 200 and also through the opposing side walls provides improved thermal characteristics of the device 200. The carrier, which acts as a heat sink is exposed, rather than covered by the mold material, and thus any heat generated in the die during operation of the device may be efficiently dissipated away from the semiconductor die 210. This may be particularly advantageous where the device is a high power device.

Furthermore, and as discussed in more detail below with respect to the method of fabrication, the arrangement of the carrier 212 in the device 200, when compared to conventional devices, is provided without increasing the overall package height of the device 200.

Furthermore, the carrier 212 also provides mechanical strength to the device 200 by supporting the semiconductor die 210. This is particularly advantageous where the device 200 is used in harsh environmental conditions such as in automotive applications.

Figure 3A:
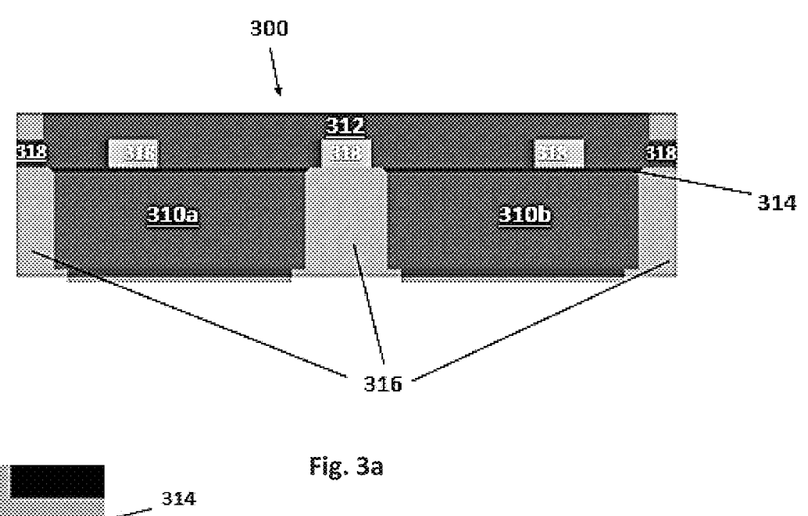
FIG. 3a is a side view of a semiconductor device, incorporating multiple semiconductor dies according to an embodiment.

FIG. 3a illustrates a multi-die CSP semiconductor device 300 embodiment, whereby multiple semiconductor dies 310a, 310b are arranged in the CSP semiconductor device 300. As with the previous embodiment, the dies will be fixed to a carrier 312 using, for example, an epoxy based adhesive. The mold material 316 is arranged to separate the multiple dies 310a, 310b. This arrangement may be advantageous, where the semiconductor dies 310a, 310b are arranged in, for example a cascode, or half-bridge configurations.

Figure 3B:
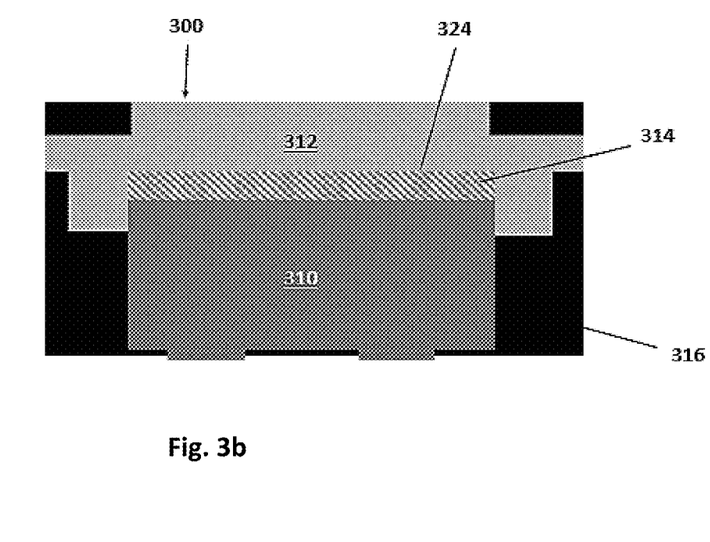
FIG. 3b is a side view of chip scale package semiconductor device according to an embodiment.

FIG. 3b illustrate an embodiments, whereby the carrier 312 includes as a recessed portion for accommodating the adhesive 314 and/or an upper portion of the semiconductor die 310. In the embodiment of FIG. 3b the recessed portion of the carrier 312 is sized to receive the semiconductor die 310 and the adhesive 314 arranged thereon. Alternatively, the recessed portion 324 of the carrier 312 may be sized to receive the adhesive 314 arranged on the semiconductor die 310. The arrangement of FIG. 3b may be advantageous in reducing the overall package height of the device 300. In addition adhesive bleeds may be prevented by containing the adhesive 314 within the recess 324 of the carrier 312. The skilled person will also understand that the embodiment of FIG. 3b is also amenable to multi-die arrangements such as the arrangement of FIG. 3a.

An example process flow for manufacturing the semiconductor device according to the above embodiments will now be described with reference to FIGS. 4a to 4h which illustrates example process steps.

Figure 4A:
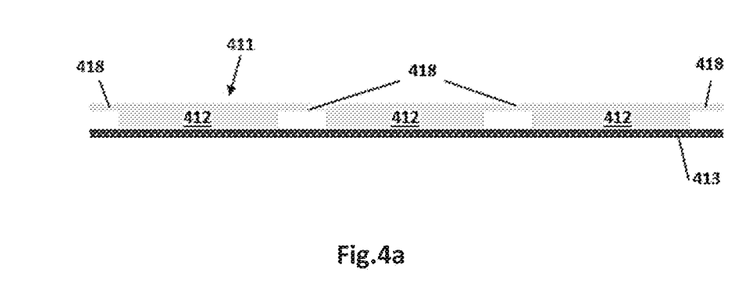
FIG. 4a illustrates the step of arranging a frame arranged on a carrier tape according to an embodiment.
Figure 4B:
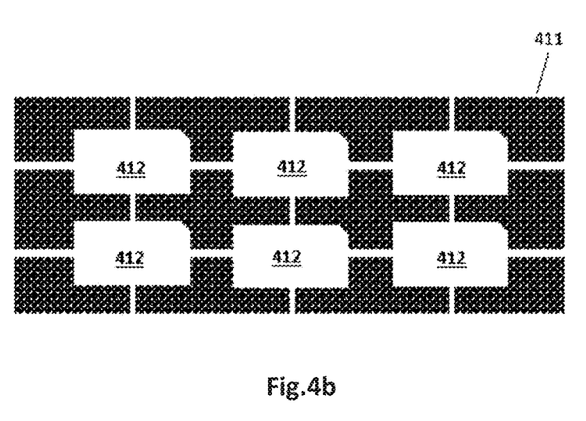
FIG. 4b Illustrates a frame arranged as a repeating matrix of carriers according to an embodiment.

With reference to FIG. 4a, a metallic frame 411 is arranged on a carrier tape 413. The carrier tape 413 prevents mold material from covering the carrier during the molding process and ensures that, as discussed above with reference to FIGS. 2a and 2d that the carrier 412 is exposed and protrudes through the top surface 402 of the device 400. The metallic frame comprises a repeating matrix of carriers 412 whereby neighbouring carriers are interconnected by connecting members 418 or tie bars. The matrix of carriers interconnected by the connecting members 418 may be a linear matrix. Alternatively, and as illustrated in the plan view of FIG. 4b, the matrix of carriers may be n×m matrix, where n is the number of rows in the matrix and m is the number of columns in the matrix, and where n and m are both positive integers, with adjacent carriers 412 connected by connecting members 418. The example of FIG. 4b illustrates one connecting member 418 connecting adjacent carriers in any row or column. However, consistent with the example of FIG. 2b, the skilled person will appreciate the number of connecting members 418 may be greater than one on any one side of the device.

Figure 4C:
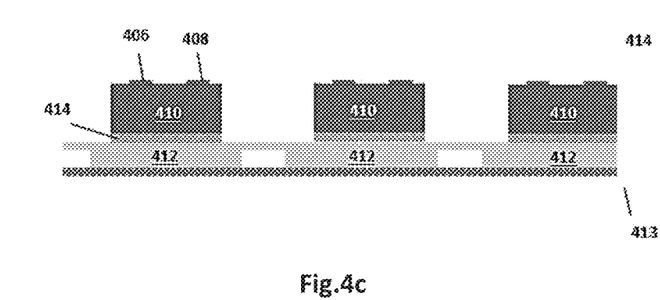
FIG. 4c illustrates the step of arranging semiconductor dies on the carriers according to an embodiment.

As illustrated in FIG. 4c, semiconductor dies 410 are then attached to respective carriers 412 using a die attach material 414, such as an epoxy based adhesive as mentioned above, or any appropriate solder or glue. In certain applications the die attach material may be conductive to enable electrical connection from the carrier 412 to the semiconductor die 410. It should be noted that the semiconductor dies 410 are attached top down to the carrier 412. In other words the top major surface of the semiconductor die 410, that is, the major surface opposing the surface having the contacts 406, 408 is affixed to a respective carrier using the adhesive 414. The adhesive may then be set or solidified by heat curing.

Figure 4D:
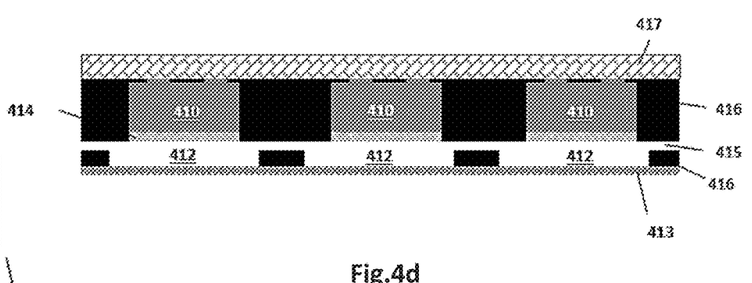
FIG. 4d illustrates the step packaging of the semiconductor dies attached to the carriers according to an embodiment.

Following the semiconductor die 410 attach process discussed above, the arrangement of semiconductor dies attached to the carriers is then packaged. FIG. 4d illustrates a packaging process known as film assisted molding (FAM), whereby a protective film 417 is applied over the matrix of attached or fixed dies. The matrix is then loaded into a molding machine whereby the liquefied molding material is forced into closed mold cavities formed by the protective film 417 and the carrier tape 413. The molding material is then solidified by curing.

When the molded matrix is removed from the molding machine the protective film 417 is also removed. Following the molding process, the matrix may also undergo a process known as post mold curing to further cure and solidify the liquefied molding material.

Figure 4E:
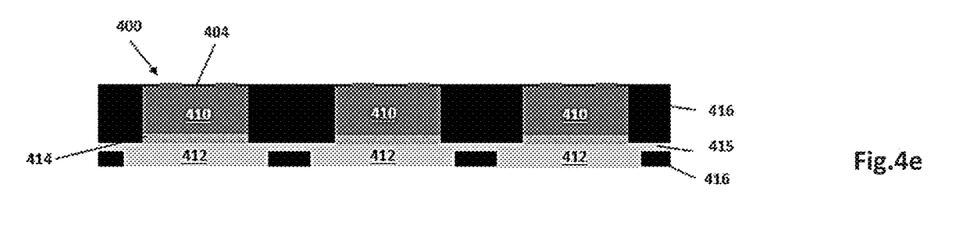
FIG. 4e illustrates the step of de-taping following packaging according to an embodiment.
Figure 4F:
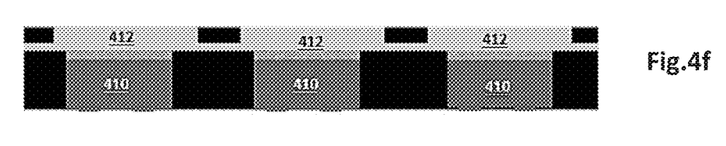
FIG. 4f illustrates the step of deflashing following de-taping according to an embodiment.
Figure 4G:
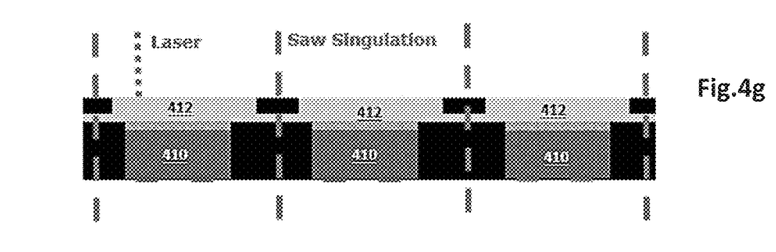
FIG. 4g illustrates the step of product marking according to an embodiment.
Figure 4H:
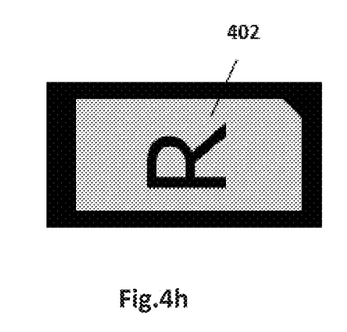
FIG. 4h illustrates an example product marking on the carrier according to an embodiment.

Following molding and curing, the carrier tape is removed, by a process known as de-taping, from the molded matrix as illustrated in FIG. 4e. When de-taping is completed, any excess mold material present on the contacts or on the exposed side of the carrier is removed, as illustrated in FIG. 4f by a process known as deflashing. Once deflashing is completed the exposed side of the carrier may be marked with device details such as for example a product type, using for example a laser, as illustrated in FIG. 4g.

Figures 5A, 5B:
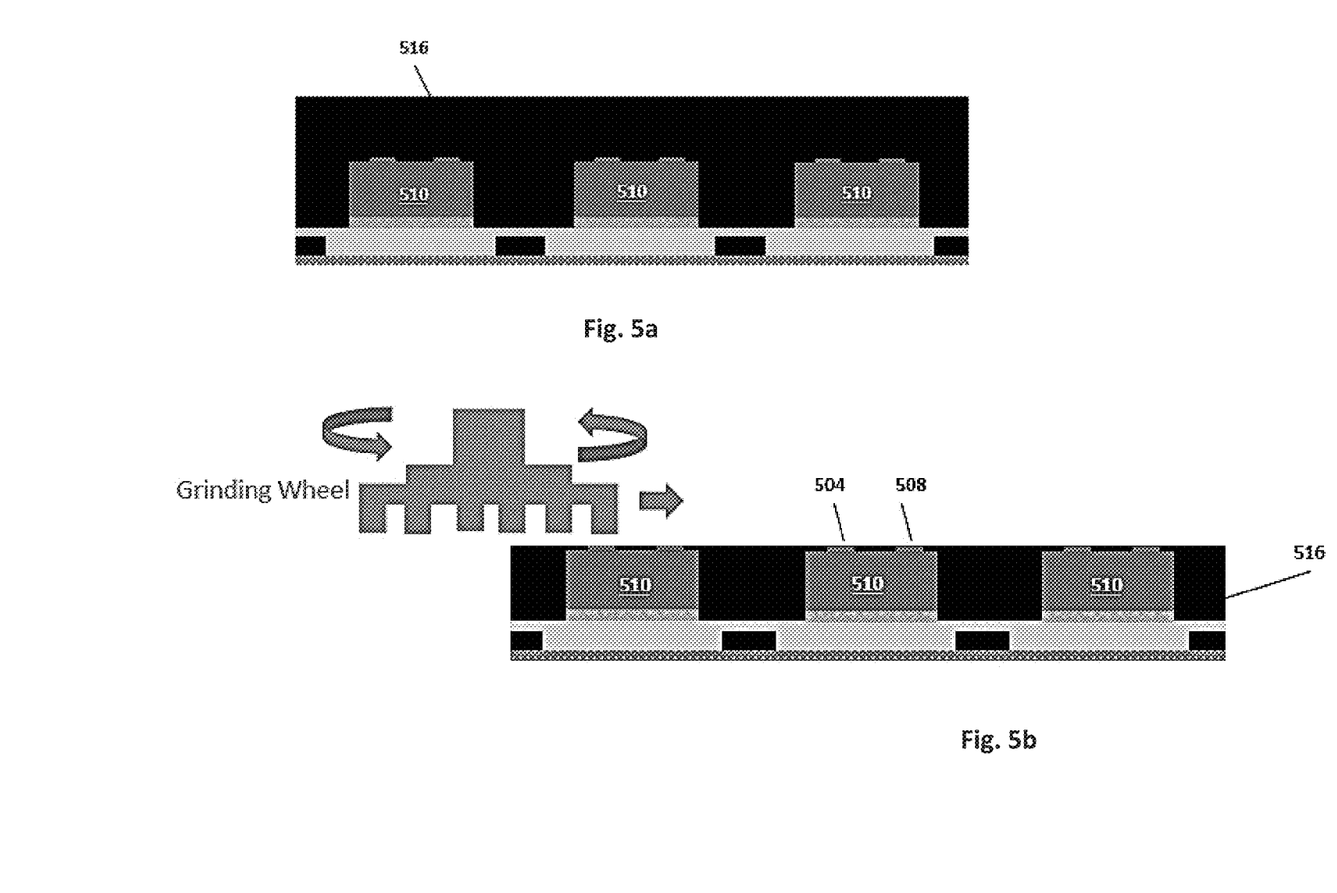
FIG. 5a illustrates an over molding process for packaging the CSP according to an embodiment.
FIG. 5b illustrates a grinding process following over molding according to an embodiment.

As an alternative to the FAM process mentioned above, the molding may be achieved using an over-molding process as illustrated in FIGS. 5a and 5b. In the over-molding process, the mold material 516 is arranged to completely cover the semiconductor dies 510, including the contacts arranged thereon. Following curing of the mold material 516, the mold material is removed until the contacts are exposed using a grinding process.

Following marking, individual CSP semiconductor devices 400 are separated by singulation from the matrix arrangement. Singulation is carried out along the sidewall walls of the semiconductor devices 400. The singulation process may be any appropriate cutting process, such as laser cutting, plasma cutting, saw cutting or any combination thereof, in order to separate the devices 400. The step of singulation severs the connecting members 418 and the mold material 416 of adjacent devices 400. This results in the tabs 218 as discussed above with respect to FIG. 2a extending through mold material 416 at the side walls of the device 400.

Following singulation, the devices may be electrically tested to ensure that they have not been damaged during the packaging process. Following testing the devices may be placed on a carrier tape and loaded on reel in preparation for shipping.

The CSP semiconductor device according to the embodiments provides for improved heat dissipation and structural integrity, without increasing the height of the overall package. The CSP device according to embodiments is therefore suited to high power transistor devices.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A chip scale package semiconductor device, comprising;
   a semiconductor die having a first major surface and an opposing second major surface, the semiconductor die comprising a plurality of terminals including a source electrode and a drain electrode arranged directly on the second major surface on opposite sides of the semiconductor die to electrically connect the second major surface of the semiconductor die to an external circuit component;
   a carrier comprising a first major surface and an opposing second major surface, wherein the first major surface of the semiconductor die is mounted on the opposing second major surface of the carrier, wherein the carrier does not form an electrode, wherein the opposing second major surface of the carrier is arranged as a recess in the carrier; and
   a molding material partially encapsulating the semiconductor die and the carrier of the chip scale package semiconductor device, wherein the first major surface of the carrier extends and is exposed through the molding material on a first side of the chip scale package semiconductor device, and the at least two terminals are exposed through the molding material on a second side of the chip scale package semiconductor device.

2. The chip scale package semiconductor device of claim 1, wherein the carrier extends through and is exposed through the molding material on opposing side walls of the chip scale package semiconductor device.

3. The chip scale package semiconductor device of claim 1, wherein the first major surface of the carrier is co-planar with the molding material on a top major surface of the chip scale package semiconductor device.

4. The chip scale package semiconductor device of claim 1, wherein the recess is arranged to mountably receive the semiconductor die.

5. The chip scale package semiconductor device of claim 1, wherein the recess is arranged to receive an adhesive layer for mounting the semiconductor die to the carrier.

6. The chip scale package semiconductor device of claim 1, further comprising a top major surface and a second opposing major surface of the chip scale package device, wherein the top major surface comprises the carrier, and wherein the second opposing major surface comprises the terminals and the molding material.

7. A method of manufacturing a chip scale package semiconductor device, the method comprising:
   providing a semiconductor die having a first major surface and an opposing second major surface, the semiconductor die comprising a plurality of terminals including a source electrode and a drain electrode arranged directly on the second major surface on opposite sides of the semiconductor die and configured to electrically connect the second major surface of the semiconductor die to an external circuit component;
   providing a carrier comprising a first major surface and an opposing second major surface, wherein the carrier does not form an electrode, wherein the opposing second major surface of the carrier is arranged as a recess in the carrier;
   mounting the first major surface of the semiconductor die to the opposing second major surface of the carrier;
   partially encapsulating the semiconductor die and the carrier of the chip scale package semiconductor device in a molding material, wherein the first major surface of the carrier extends through and is exposed through molding material on a first side of the chip scale package semiconductor device, and the at least two terminals are exposed through molding material on a second side of the chip scale package semiconductor device to form a lateral chip-scale package semiconductor device.

8. The method of claim 7, wherein the semiconductor die and the carrier are encapsulated such that the first major surface of the carrier is co-planar with the molding material on a top major surface of the chip scale package semiconductor device.

9. The chip scale package semiconductor device of claim 1, wherein the at least two terminals extend orthogonally from the second major surface through the molding material so that the at least two terminals are exposed on the second side of the chip scale package semiconductor device.

10. The method of claim 7, wherein the at least two terminals extend orthogonally from the second major surface through the molding material so that the at least two terminals are exposed on the second side of the chip scale package semiconductor device.

* * * * *